United States Patent [19]

Wang

[11] Patent Number: 4,574,177

[45] Date of Patent: Mar. 4, 1986

[54] PLASMA ETCH METHOD FOR $TiO_2$

[75] Inventor: Chung S. Wang, Plano, Tex.

[73] Assignee: Texas Instruments Incorporated, Dallas, Tex.

[21] Appl. No.: 671,027

[22] Filed: Nov. 13, 1984

Related U.S. Application Data

[63] Continuation of Ser. No. 344,562, Feb. 1, 1982, abandoned.

[51] Int. Cl.⁴ .......................... B23K 9/00; G02B 5/14
[52] U.S. Cl. .................... 219/121 PE; 219/121 PF; 204/192 EC; 156/643; 156/646
[58] Field of Search ................. 219/121 PD, 121 PE, 219/121 PG, 121 PF; 204/192 E, 192 P, 192 EC; 156/643, 646, 659.1; 148/187

[56] References Cited

U.S. PATENT DOCUMENTS

| | | | |
|---|---|---|---|
| 4,288,283 | 9/1981 | Umezaki et al. | 156/643 |
| 4,313,648 | 2/1982 | Yano et al. | 204/192 E |
| 4,350,729 | 9/1982 | Nakano et al. | 156/659.1 |
| 4,367,119 | 1/1983 | Logan et al. | 156/646 |
| 4,402,126 | 9/1983 | Chapman | 148/187 |

Primary Examiner—M. H. Paschall
Attorney, Agent, or Firm—Robert Groover, III; James T. Comfort; Melvin Sharp

[57] ABSTRACT

A method for plasma etching of $TiO_2$, using a mixture of oxygen and a fluorine-bearing species, preferably $CF_4$. This mixture gives good selectivity over aluminum and photoresist, and approximately unity selectivity over silica or silicon nitride. Use of a chlorine-containing species is also taught by the invention, and will provide different selectivities. The present invention is also useful for etching in the RIE mode.

14 Claims, 5 Drawing Figures

PLASMA ETCH METHOD FOR TiO$_2$

This is a continuation of application Ser. No. 344,562, filed Feb. 1, 1982, now abandoned.

BACKGROUND OF THE INVENTION

The present invention relates to a method for etching TiO$_2$, and particularly for selective patterning of thin TiO$_2$ films.

TiO$_2$ has highly desirable properties as an electronic material, particularly its dielectric constant. The dielectric constant of crystalline rutile is approximately 125, and as-deposited polycrystalline TiO$_2$ can reliably be formed with a dielectric constant of 100 or better. Moreover, polycrystalline TiO$_2$ has high resistivity, which (for polycrystalline material) can be $10^8$ ohm-cm or better.

Thus, it would be highly desirable to be able to use TiO$_2$ for reasonably compact capacitors in integrated circuits. For example, a capacitor one mil square, having a TiO$_2$ dielectric 100 nm thick atop a 10 nm SiO$_2$ layer, would theoretically have a capacitance of 2.2 pF. Such capacitors are particularly desirable in communications and signal processing IC's. TiO$_2$ could also be used to form large-value discrete capacitors.

In addition, TiO$_2$ has the very desirable property that, when applied over a very thin silicon dioxide gate dielectric, the TiO$_2$ tends to "plug" pinhole defects in the oxide, so that the yield rate on, e.g., 10 nm SiO$_2$ gate dielectrics is greatly increased. Since the dielectric constant of TiO$_2$ is so much larger than that of SiO$_2$, TiO$_2$ is electrically invisible, and the completed device behaves as if it had only a perfect 10 nm oxide in place. Thus, use of TiO$_2$ as an extra layer in MIS gate dielectrics would permit very-high-yield fabrication of gate dielectrics which behaved as if they were extremely thin (10 nm or less).

However, realization of these theoretical advantages has hereto been in practice impossible, because TiO$_2$ is chemically inert, and all efforts to wet etch it failed. For example, TiO$_2$ is almost completely inert to HCl, H$_2$SO$_4$, or HF. The rutile form of TiO$_2$, which has particularly advantageous electrical properties, is also particularly inert.

A further area of application where the ability to etch TiO$_2$ would be highly desirable is in multi-dielectric nonvolatile memory cells. In these cells, particularly where fast writing speeds are desired, very thin bottom dielectric layers are used, and a layer of TiO$_2$ above the trapping layers provides good resistance to breakdown without degrading the electrical characteristics of the cell.

It is thus an object of the present invention to provide a method for etching TiO$_2$.

It is a further object of the present invention to provide a method for etching TiO$_2$ selectively with respect to photoresist.

It is a further object of the present invention to provide a method for etching TiO$_2$ selectively with respect to aluminum.

It is a further object of the present invention to provide a method for etching a stack of TiO$_2$ atop silicon dioxide (or nitride) such that a self-aligned etch of the TiO$_2$ and of the silicon dioxide (or nitride) is performed.

It is a further object of the present invention to provide a method for etching a layer of TiO$_2$ underneath a layer of polysilicon such that the etched patterns of TiO$_2$ and polysilicon are self-aligned.

SUMMARY OF THE INVENTION

To achieve the foregoing objects and other advantages, the present invention provides a plasma etch for TiO$_2$. In the preferred embodiment, a reactive gas mixture of CF$_4$ and O$_2$ is used, but other fluorine-bearing species may also be used. In addition, chlorine-bearing species may alternatively be used, which gives a different set of selectivities. The present invention may also be used with a reactor which is configured in the RIE mode, although this configuration is less convenient for many purposes.

According to the present invention, there is provided:

a method for selectively etching a layer of TiO$_2$, comprising the steps of:

providing a layer of TiO$_2$;

forming a patterned layer of masking material on said TiO$_2$;

exposing said TiO$_2$ layer to a halogen-bearing atmosphere; and applying RF power to said halogen-bearing atmosphere near said TiO$_2$ layer.

BRIEF DESCRIPTION OF THE DRAWINGS

The present invention will be described with respect to the accompanying drawings, wherein.

DESCRIPTION OF THE PREFERRED EMBODIMENTS

Figure 1:
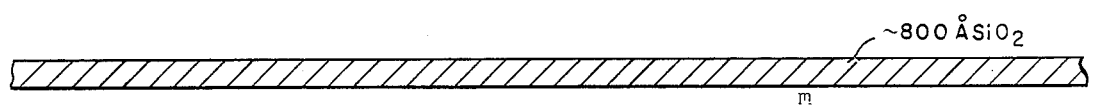
FIGS. 1 through 5 show a sequence of steps for patterning a nonvolatile transistor containing silicon dioxide, silicon nitride, and TiO$_2$ beneath a polysilicon gate.

Deposition of TiO$_2$, in the presently preferred embodiment, is performed by deposition of titanium metal (e.g. by evaporation), followed by oxidation of the titanium metal. This process reliably yields polycrystalline rutile. (TiO$_2$ has multiple crystalline forms, and rutile is the most desirable, although the others are also useful.) Alternatively, if a high-temperature oxidation step must be avoided, CVD deposition of TiO$_2$ may be used.

The TiO$_2$ plasma etch, in the presently preferred embodiment, uses the following parameters: In a 22 inch reactor with one-half inch spacing, 1,000 watts is applied, to produce a power density of approximately one-half watt per square centimeter. At a substrate temperature of approximately 75° C. and an absolute pressure of approximately 300 microns, a mixture of tetrafluoromethane and oxyen is applied, at a rate of 200 standard cubic centimeters per minute of CF$_4$ and 4 standard cubic centimeters per minute of O$_2$.

The etch rate of TiO$_2$ with these parameters is approximately 26 nm per minute. This mixture produces an etch rate of approximately 27 nm per minute on silicon dioxide or on silicon nitride, and 80 nm/min on silicon, so that the selectivity of TiO$_2$ with respect to these other materials is less than unity. However, the selectivity of TiO$_2$ with respect to aluminum or photoresist is quite good.

Alternatively, this etch mixture can be used in an RIE mode to etch TiO$_2$. Thus, a reactor can be set up with 4.25 inch spacing and driven at the substrate holder with 600 watts, with a gas flow of 200 standard cubic centimeters per minute of CF$_4$ and 100 standard cubic centimeters per minute of O$_2$ at 170 microns total pressure, to attain an etch rate of about 53 nm per minute.

This is still an inconveniently high etch rate, so that overetching may easily occur. Moreover, plasma etching is more compatible with usual processing equipment arrangements for mass production.

It should be noted that other fluorine-bearing species besides $CF_4$ are useful. For example, $C_2F_6$, $C_3F_8$, or other fluorinated hydrocarbons or fluorinated silane species, are suitable.

In addition, compounds bearing other halogen elements are also useful, since other tetrahalides of titanium are also volatile. Thus, for example, substitution of $CCl_4$ for the $CF_4$ alternatively produces greatly improved selectivity of $TiO_2$ over silicon dioxide, although the selectivity with respect to aluminum or polysilicon will be greatly degraded. Bromine-containing compounds are also useful to effect plasma or RIE etching of $TiO_2$, although the secondary residual products deposited make this a less attractive approach in practice.

Moderate anisotropy is attained with the above plasma etching conditions. If greater anisotropy is desired, this can of course be obtained by reducing the gas pressure.

Since $TiO_2$ has proven to be so resistant to efforts at wet etching, the above plasma-etching process is critical to the practicality of using $TiO_2$ in semiconductor IC processing.

Figure 2:
Figure 3:
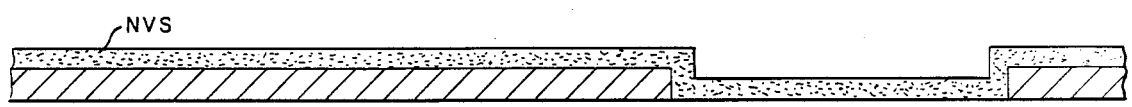
Figure 4:
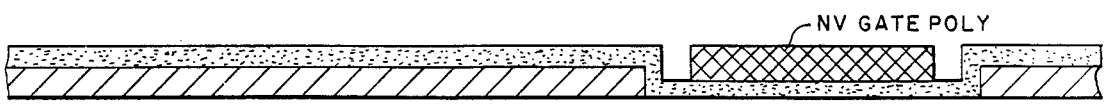
Figure 5:
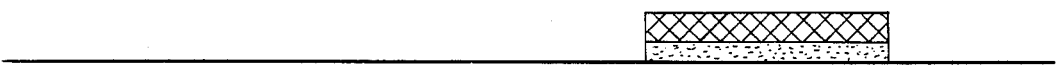

The application of the present invention to a specific embodiment, wherein a transistor for nonvolatile information storage having dielectric layers of oxide, nitride, and $TiO_2$ is fabricated, is shown in FIGS. 1 through 5. The critical step appears in FIGS. 3 through 5. After the polysilicon is deposited and patterned, a polysilicon plasma etch is used to cut the polysilicon top layer. The $TiO_2$ etch of the present invention is then used. Finally, a wet etch or plasma etch is used to cut through the bottom oxide.

Further discussion of the application of this invention to preparation of nonvolatile transistors is contained in simultaneously-filed U.S. Pat. No. 4,472,791 of R. Haken, CMOS Unipolar 4-Transistor 3-Control Line Nonvolatile Memory Cell (TI-8830), of common assignee, which is hereby incorporated by reference.

The present invention is believed to provide the first known selective etch for $TiO_2$. It will be apparent to those skilled in the art that a very broad range of equivalents, particularly substitution of chemical species and variation in processing parameters, are useful in practicing the present invention. For example, the flow rates specified for $CF_4$ and $O_2$ may be varied widely, particularly if similar proportions are maintained. Some of the key ideas of the present invention, which may be recognized in widely differing embodiments, include: (1) plasma- or RIE-etching $TiO_2$, (2) in a halogen-bearing gas, (3) with a small admixture of oxygen, (4) particularly where the fluorine is the halogen.

What is claimed is:

1. A method for selectively etching a layer of $TiO_2$, comprising the steps of:
   (a) providing a layer of $TiO_2$;
   (b) forming a patterned layer of masking material on said $TiO_2$;
   (c) exposing said patterned $TiO_2$ layer to an atmosphere of a carbohalogen and oxygen at a pressure greater than 0.1 Torr; and
   (d) applying RF power to said carbohalogen atmosphere near said $TiO_2$ layer.

2. The method of claim 1, wherein said halogen-bearing species contains a halogen element selected from the group consisting of chlorine and fluorine.

3. The method of claim 2, wherein said halogen-bearing species is a fluorine-bearing species.

4. The method of claim 3, wherein said gas mixture comprises $CF_4$ and $O_2$.

5. The method of claim 4, wherein said gas mixture is flowed at a rate of between 50 and 400 standard cubic centimeters per minute of $CF_4$ and between 1 and 8 standard cubic centimeters per minute of $O_2$, at an absolute pressure of between 100 and 1,000 microns.

6. The method of claim 2, wherein said gas mixture comprises a chlorine-bearing species.

7. The method of claim 6, wherein said gas mixture comprises $CCl_4$.

8. The method of claim 1, 2, or 5, wherein said masking material comprises photoresist.

9. The method of claim 1, wherein said step of providing a layer of $TiO_2$, said layer substantially rutile, comprises the steps of:
   depositing a layer of metallic titanium;
   oxidizing said titanium to provide said layer of $TiO_2$.

10. A method for forming polysilicon gates for MIS transistors, comprising the steps of:
    (a) providing a semiconductor surface;
    (b) forming a thin insulating layer on said surface;
    (c) forming a layer of $TiO_2$ on said thin insulating layer;
    (d) forming a layer of polysilicon on said $TiO_2$ layer;
    (e) forming a patterned layer of photoresist on said polysilicon layer;
    (f) plasma etching said polysilicon layer;
    (g) plasma etching said patterned $TiO_2$ layer in a mixture of a carbohalogen species and oxygen; and
    (h) etching said thin insulator layer; whereby polysilicongate structures are defined.

11. A method for selectively etching a layer of rutile, comprising the steps of:
    (a) providing a layer of rutile;
    (b) forming a patterned layer of masking material on said rutile;
    (c) exposing said patterned rutile layer to an atmosphere of a carbohalogen and oxygen at a pressure greater than 0.1 Torr; and
    (d) applying RF power to said carbohalogen and oxygen atmosphere near said rutile layer.

12. A method of etching $TiO_2$ selectively relative to aluminum and photoresist, and at a rate at least comparable to that of silicon, silicon dioxide, and silicon nitride, comprising the steps of:
    (a) providing exposed surfaces of $TiO_2$ and aluminum;
    (b) flowing a gas mixture over said $TiO_2$ and aluminum simultaneously, including a fluorocarbon plus oxygen; and
    (c) exciting said mixture into a plasma.

13. The method of claim 12, wherein:
    (a) said gas mixture has a total pressure in the range of 100 microns to 1000 microns.

14. the method of claim 12, wherein:
    (a) said gas mixture essentially consists of fluorocarbon plus oxygen with the ratio of fluorocarbon to oxygen greater than one.

* * * * *